United States Patent
Lee

(10) Patent No.: US 6,699,793 B2
(45) Date of Patent: Mar. 2, 2004

(54) SEMICONDUCTOR DEVICE HAVING MULTI-LAYERED SPACER AND METHOD OF MANUFACTURING THE SAME

(75) Inventor: Jae-goo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/994,154

(22) Filed: Nov. 26, 2001

(65) Prior Publication Data

US 2002/0110966 A1 Aug. 15, 2002

(30) Foreign Application Priority Data

Feb. 13, 2001 (KR) .......................................... 2001-6983

(51) Int. Cl.$^7$ ............................................ H01L 21/311
(52) U.S. Cl. ...................................................... 438/696
(58) Field of Search ................................. 438/265, 366, 438/696, 595, 443

(56) References Cited

U.S. PATENT DOCUMENTS

| 6,040,223 A | 3/2000 | Liu et al. ................... 438/303 |
|---|---|---|
| 6,071,826 A | 6/2000 | Cho et al. ................... 438/723 |
| 6,165,883 A | * 12/2000 | Hiura .......................... 438/592 |
| 6,329,225 B1 | * 12/2001 | Rodder ........................ 438/151 |

FOREIGN PATENT DOCUMENTS

| JP | 2000156502 | 6/2000 | .......... H01L/29/28 |
|---|---|---|---|
| KR | P1996-0035923 | 10/1996 | .......... H01L/21/336 |

* cited by examiner

Primary Examiner—W. David Coleman
(74) Attorney, Agent, or Firm—Mills & Onello, LLP

(57) ABSTRACT

A semiconductor device having a multi-layered spacer and a method of manufacturing the semiconductor device include gate electrodes each comprising a gate oxide layer, a gate conductive layer, and a capping dielectric layer formed on a semiconductor substrate, a gate polyoxide layer formed on sidewalls of the gate conductive layer and the gate oxide layer and being in contact with a predetermined portion of the semiconductor substrate, a silicon nitride layer being in contact with sidewalls of the capping dielectric layer and the gate polyoxide layer, an oxide layer being in contact with the silicon nitride layer, and an external spacer being in contact with the oxide layer.

16 Claims, 8 Drawing Sheets

SEMICONDUCTOR DEVICE HAVING MULTI-LAYERED SPACER AND METHOD OF MANUFACTURING THE SAME

BACKGROUND OF THE INVENTION

1. Field of the Invention

The present invention relates to a semiconductor device and a method of manufacturing the same, and more particularly, to a semiconductor device having a multi-layered spacer and a method of manufacturing the same.

2. Description of the Related Art

As the techniques of manufacturing semiconductor devices evolve, integration density improves with a reduction in the size of patterns. In order to increase the integration density of memory devices, i.e., in order to increase the capacity of DRAMs to greater than a gigabit, patterns having a design rule of 0.18 µm or less are needed, along with processes required for the formation of such patterns. In addition, contemporary semiconductor memory devices demand high refresh characteristics. For the improvement of these refresh characteristics, a device having a double-layered spacer has been developed to replace a device having a single-layered spacer made of silicon nitride.

FIGS. 1 through 8 are cross-sectional views for describing the steps of manufacturing a semiconductor device having a conventional double-layered spacer. Referring to FIG. 1, a field area 12 is formed on a semiconductor substrate 10 to define an active area. The active area includes areas 14 where sources and drains will be formed and areas where gate electrodes 18 will be formed. Next, gate electrodes 18 are formed on the semiconductor substrate 10. Each of the gate electrodes 18 include a gate oxide layer 15, a gate conductive layer 16, and a capping dielectric layer 17. A first gate polyoxide layer 19 is grown on the semiconductor substrate 10. In a case where the capping dielectric layer 17 is formed of silicon nitride, the first gate polyoxide layer 19 is not grown on the sidewalls and top of the capping dielectric layer 17. In other words, the first gate polyoxide layer 19 is formed only on the sidewalls of the gate conductive layer 16 and the gate oxide layer 15, and on the semiconductor substrate 10. Impurities are implanted to a low density into the source and drain areas 14 using the gate electrode 18 as an ion implantation mask. The first gate polyoxide layer 19 serves as a buffer layer when implanting impurities.

With reference to FIG. 2, an oxide layer 20 is deposited over the surface of the semiconductor substrate 10 having a step difference due to the presence of the gate electrode patterns 18. A silicon nitride layer is deposited over the surface of the oxide layer 20 having a step difference and is then etched by an anisotropic method, thereby forming external spacers 22 on the sidewalls of the gate electrodes 18. Here, the oxide layer 20 is used as an etching stopper in an etching process of forming the external spacers 22. At the same time, there is a difference in pattern density between different regions of a device, for example in core or periphery region and a cell region in a device. Over etching therefore tends to occur during the etching process for forming external spacers in a core or periphery region having low pattern density. The oxide layer 20 and the first gate polyoxide layer 19 are etched due to this over etching. Thus, the oxide layer 20 does not serve as an etching stopper. As a result, a semiconductor substrate 10, i.e., silicon (Si), is recessed. This recess deteriorates refresh characteristics of a device. Following etching, impurities are implanted to a high density into the source and drain areas 14 to form device sources and drains.

Referring to FIG. 3, the portion of the oxide layer 20 on the semiconductor substrate 10 between the external spacers 22 is removed. The first gate polyoxide layer 19 on the semiconductor substrate 10 between the external spacers 22 is also removed when the oxide layer 20 is etched.

With reference to FIG. 4, a second gate polyoxide layer 23 is grown on the semiconductor substrate 10 between the external spacers 22. The second gate polyoxide layer 23 prevents direct adhesion between the semiconductor substrate 10 and an etching stopper, which will be described below. In other words, the etching stopper, e.g., the silicon nitride layer, does not adhere well to the semiconductor substrate 10. Thus, the second gate polyoxide layer 23 is formed to prevent the silicon nitride layer from separating from the semiconductor substrate 10. The second gate polyoxide layer 23 is formed at a high temperature of about 850° C. with the implantation of oxygen. As a result, impurities densely implanted in the source and drain areas 14 are diffused in a lateral direction. Thus, the length of a channel between the source and drain gets shorter. Also, oxygen penetrates into the gate oxide layer 15 through an oxide layer 20a underneath the external spacer 22 when the second gate polyoxide layer 23 is grown. Due to this, both sides of the gate oxide layer 15 get thicker and thus threshold voltage varies. This phenomenon becomes more serious when the integration of semiconductor devices increases and design rules decrease.

An etching stopper 24 is formed over the surface of the semiconductor substrate 10 having a step difference to be used as an etching stopper when a self-aligned contact is etched. The etching stopper 24 is formed of silicon nitride. In the meantime, in a core or periphery area having low pattern density, the second gate polyoxide layer 19 is etched when a photoresist pattern (not shown) is removed in a process of implanting impurity ions. Thus, the etching stopper 24 in the core or periphery area, e.g., the silicon nitride layer, directly adheres to the semiconductor substrate 10. Therefore, the silicon nitride layer may separate from the semiconductor substrate 10 if they are stressed in a subsequent process. This may lead to a phenomenon referred to as bubble defect which results when an inert gas such as argon (Ar), used as an etching gas, penetrates between the semiconductor substrate 10 and the etching stopper 24 when a first interlevel dielectric layer 26 is deposited on the entire surface.

A first interlevel dielectric layer 26 is deposited on the semiconductor substrate 100 on which the etching stopper is formed 24. The first interlevel dielectric layer 26 is planarized by chemical mechanical polishing to ensure a photolithography margin.

Referring to FIG. 5, a photoresist pattern (not shown) is formed using a photolithography, in order to form self-aligned contacts, i.e., areas in which pads will be formed. The photoresist pattern defines the areas in which pads will be formed. The first interlevel dielectric layer 26 is etched using the photoresist pattern as an etching mask until the etching stopper 24 on the source and drain areas 14 is exposed. The etching stopper 24 on the tops and sidewalls of the gate electrodes 18 and the oxide layer 20 on the tops of the gate electrodes 26 are removed when the first interlevel dielectric layer 26 is etched. The capping dielectric layer 17 is also etched to a predetermined thickness. The photoresist pattern is removed using a common method, e.g., an ashing process.

With reference to FIG. 6, the etching stopper 24a and the second gate polyoxide layer 23 remaining on source and drain areas 14 are removed to form pads electrically connected to sources and drains.

Referring to FIG. 7, a polysilicon layer is deposited on the semiconductor substrate 10 and then is then planarized by chemical mechanical polishing, thereby forming pads 28.

With reference to FIG. 8, a second interlevel dielectric layer 30 is formed on the semiconductor substrate 10 on which the pads 28 are formed. Carbon from the second interlevel dielectric layer 30, e.g., PE-TEOS layer, penetrates into the gate oxide layer 15 through an oxide layer 20b formed between the external spacer 22a and the gate electrode 18. As a result, the gate oxide layer 15 is contaminated. A carbon group serves as moveable positive ions in the gate oxide layer 15. Thus, the gate operating voltage $V_{pp}$ drops and threshold voltage varies, thereby causing serious damage to the device. In order to solve this problem, the second interlevel dielectric layer 30 is deposited and annealed, which shortens the channel. In other words, in a case where the second interlevel dielectric layer 30 is annealed at a high temperature, i.e., at a temperature of about 750~850° C., impurities implanted into the source and drain areas 14 are diffused in a lateral direction. As a result, the length of the channel between a source and drain may be shortened.

The device having the conventional double-layered spacer has the above problems. Among these problems, the representative ones are as follows. The first problem is that an oxide layer is over-etched when an external spacer is formed in a core or periphery area having low pattern density. As a result, the oxide layer does not serve as an etching stopper. Thus, the semiconductor substrate, i.e., silicon (Si), becomes recessed, which deteriorates refresh characteristics of the resulting device. Second, a second gate polyoxide layer is formed to supplement low adhesion between an etching stopper, e.g., a silicon nitride layer, and the semiconductor substrate. The second gate polyoxide layer is formed at a high temperature of about 850° C., which diffuses impurities densely implanted in the source and drain areas in a lateral direction. Thus, the length of a channel between the source and drain is shortened. Also, oxygen penetrates into a gate oxide layer through an oxide layer underneath the external spacer when the second gate polyoxide layer is grown. As a result, both sides of the gate oxide layer are thickened and threshold voltage varies. Third, the second gate polyoxide layer is etched when the photoresist pattern is removed in a process of implanting impurity ions into a core or periphery area having low pattern density. Thus, an etching stopper in the core or periphery area, e.g., a silicon nitride layer, directly contacts the semiconductor substrate. The silicon nitride layer separates from the semiconductor substrate if they are stressed in a subsequent process. Fourth, Carbon from the second interlevel dielectric layer, e.g., PE-TEOS layer, penetrates into the gate oxide layer through an oxide layer formed between the external spacer and the gate electrode. Due to this, the gate oxide layer is contaminated. A carbon group serves as moveable positive ions in the gate oxide layer. Thus, the gate operating voltage $V_{pp}$ drops and threshold voltage varies, thereby causing serious damage to a device. In order to solve this problem, the second interlevel dielectric layer is deposited and annealed, which shortens the channel. In other words, in a case where the second interlevel dielectric layer is annealed at a high temperature, impurities implanted in the source and drain areas are diffused in a lateral direction. As a result, the length of a channel between the source and drain may be shortened.

SUMMARY OF THE INVENTION

To solve the above problems, it is an object of the present invention to provide a semiconductor substrate having a double-layered spacer which can reduce a short channel effect by reducing a heat budge process, reduce changes in threshold voltage by preventing the penetration of carbon or oxygen into a gate oxide layer, and improve refresh characteristics.

It is another object of the present invention to provide a method of manufacturing a semiconductor substrate having a double-layered spacer which can reduce a short channel effect by reducing a heat budge process, reduce changes in threshold voltage by preventing the penetration of carbon or oxygen into a gate oxide layer, and improve refresh characteristics.

Accordingly, to achieve the above first object, there is provided a semiconductor substrate having a multi-layered spacer. The semiconductor substrate includes: a plurality of gate electrodes each including a gate oxide layer, a gate conductive layer, and a capping dielectric layer formed on a semiconductor substrate; a gate polyoxide layer formed on sidewalls of the gate oxide layer and the gate conductive layer and being in contact with a predetermined portion of the semiconductor substrate; a silicon nitride layer being in contact with both sidewalls of the capping dielectric layer and the gate polyoxide layer; an oxide layer being in contact with the silicon nitride layer; and an external spacer being in contact with the oxide layer.

The semiconductor substrate further includes a pad formed in a region between adjacent gate electrodes having the multi-layered spacer and being contact with the semiconductor substrate and an interlevel dielectric layer formed on the pad and each gate electrode having the multi-layered spacer.

Preferably, the gate polyoxide layer prevents the silicon nitride layer from separating from the semiconductor substrate and has a thickness of about 50~100. The gate polyoxide layer is an oxide layer formed at a temperature of about 800~900° C. with the injection of oxygen.

Preferably, the silicon nitride layer has a thickness of about 100~500 Å.

The oxide layer is an oxide layer formed at a temperature of about 600~800° C. using $SiCl_4$ and $O_2$. Preferably, the oxide layer is a middle temperature oxide layer or a high temperature oxide layer having a dielectric constant of 3.9, and has a thickness of about 100~500 Å.

Preferably, the external spacer is formed of silicon nitride or silicon oxynitride.

To achieve the second object, there is provided a method of manufacturing a semiconductor device having a multi-layered spacer. In the method, a plurality of gate electrodes each having a gate oxide layer, a gate conductive layer, and a capping dielectric layer are formed on a semiconductor substrate. A polyoxide layer is formed on both sidewalls of the gate oxide layer and the gate conductive layer and on the semiconductor substrate. A silicon nitride layer is formed over the surface of the semiconductor substrate having a step difference. An oxide layer is deposited over the surface of the silicon nitride layer having a step difference. An external spacer is formed by depositing a dielectric layer for a spacer over the surface of the oxide layer having a step difference and then etching the dielectric layer by an anisotropic method. A first interlevel dielectric layer is formed on the entire surface of the semiconductor substrate. A photoresist pattern is formed to define an area in which a pad will be formed, for example by using photolithography. The first interlevel dielectric layer is etched using the photoresist pattern as an etching mask. The photoresist pattern is removed. The silicon nitride layer and the gate polyoxide layer formed on the semiconductor substrate between the gate electrodes are removed.

Impurity ions may be lightly implanted into the semiconductor substrate between the formation of the gate polyoxide layer on a predetermined portion of the sidewalls of each gate electrode and on the semiconductor substrate and the formation of the silicon nitride layer over the surface of the semiconductor substrate having a step difference therewith.

Impurity ions may be heavily implanted into the semiconductor substrate between the formation of the external spacer by depositing a dielectric layer for a spacer over the surface of the oxide layer having a step difference and then etching the dielectric layer by an anisotropic method and the formation of the first interlevel dielectric layer on the entire surface of the semiconductor substrate.

After removing the silicon nitride layer and the gate polyoxide layer formed on the semiconductor substrate between the gate electrodes, a pad may be formed by depositing a conductive layer on the semiconductor substrate and then planarizing the resultant structure by chemical mechanical polishing and a second interlevel dielectric layer may be formed on the semiconductor substrate on which the pad is formed.

Preferably, the gate polyoxide layer is formed at a temperature of about 800~900° C. with the injection of oxygen. The gate polyoxide layer prevents the silicon nitride layer from coming off of the semiconductor substrate and has a thickness of about 50~100 Å.

Preferably, the silicon nitride layer is formed to a thickness of about 100~500 Å.

Preferably, the oxide layer is formed at a temperature of about 600~800° C. using $SiCl_4$ and $O_2$. It is preferable that the oxide layer is a middle temperature oxide layer or a high temperature oxide layer having a dielectric constant of 3.9, and has a thickness of about 100~500 Å.

Preferably, the dielectric layer for the spacer is formed of oxide or silicon nitride.

The dielectric layer for the spacer is etched by an anisotropic method until the oxide layer is exposed.

Preferably, when etching the dielectric layer for the spacer, a C-F-based gas having an etch selectivity ratio of greater than 10 of the dielectric layer for the spacer to the oxide layer is used, oxygen is used as a reaction gas, and an inert gas is used as an atmosphere.

Preferably, the dielectric layer for the spacer is etched by an anisotropic method at a pressure of about 20~100 mT, at a temperature of about 20~60° C., and at a source power of 400~800 W.

Preferably, the first interlevel dielectric layer is a HDP layer, a BPSG layer, a USG layer, a PE-TEOS layer or an SOG layer.

The first interlevel dielectric layer is etched until the silicon nitride layer on the semiconductor substrate between the gate electrodes is exposed.

The first interlevel dielectric layer is etched using a C-F-based gas having an etch selectivity ratio of greater than 10 of the first interlevel dielectric layer to the silicon nitride layer.

BRIEF DESCRIPTION OF THE DRAWINGS

The above objectives and advantages of the present invention will become more apparent by describing in detail a preferred embodiment thereof with reference to the attached drawings in which.

DETAILED DESCRIPTION OF PREFERRED EMBODIMENTS

Figure 1:
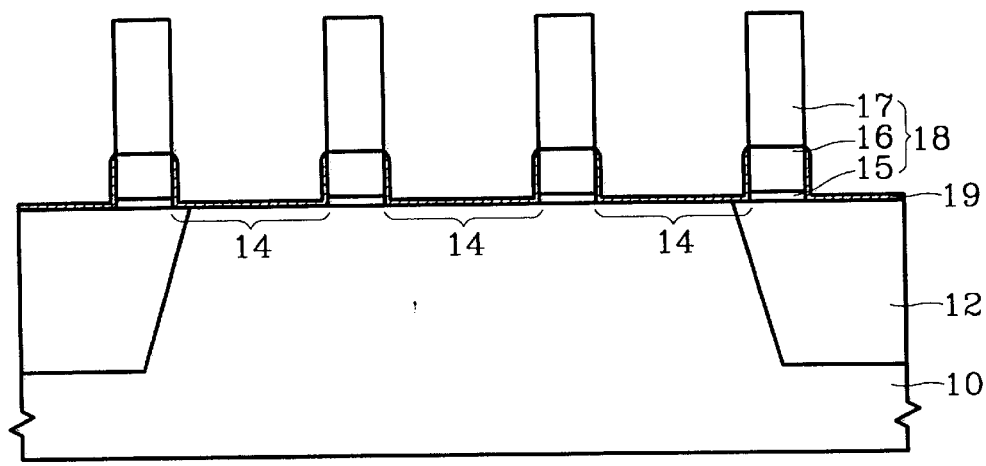
FIGS. 1 through 8 are cross-sectional views for describing the steps of manufacturing a semiconductor device having a conventional double-layered spacer.
Figure 2:
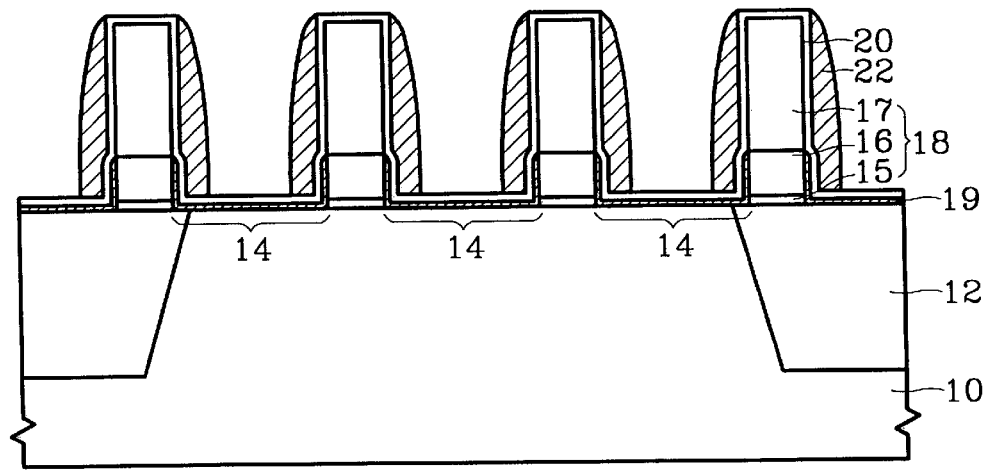
Figure 3:
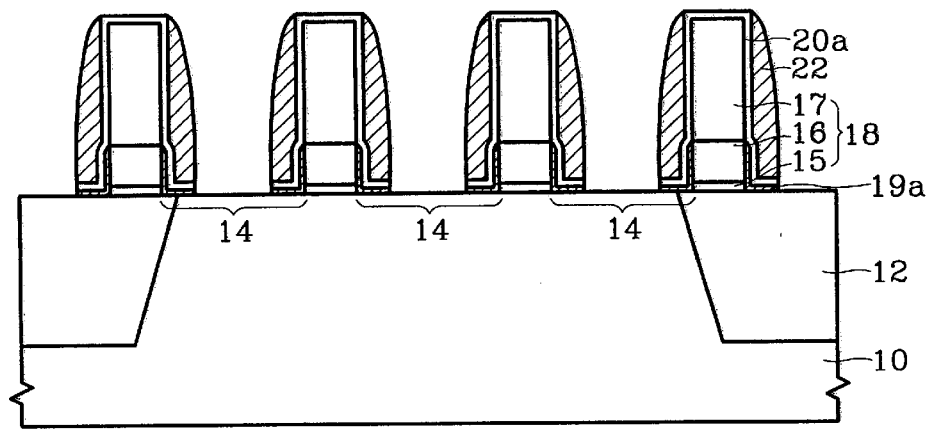
Figure 4:
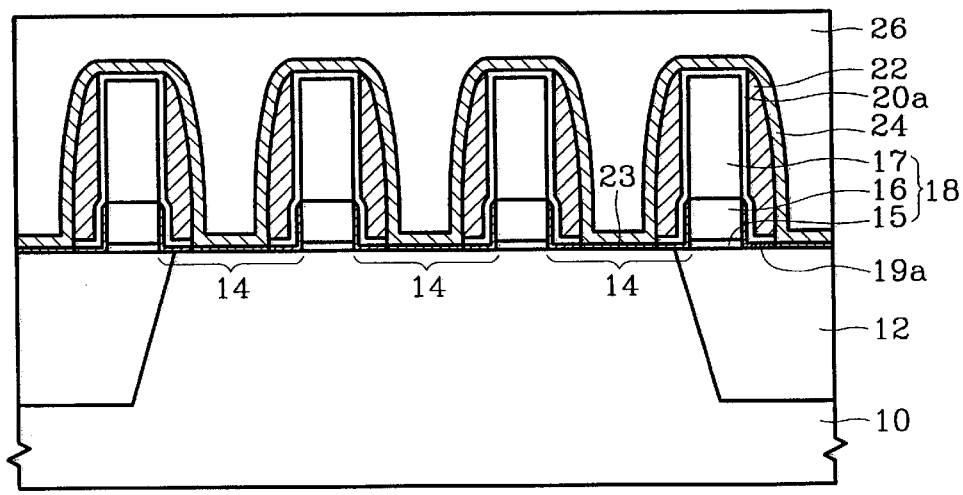
Figure 5:
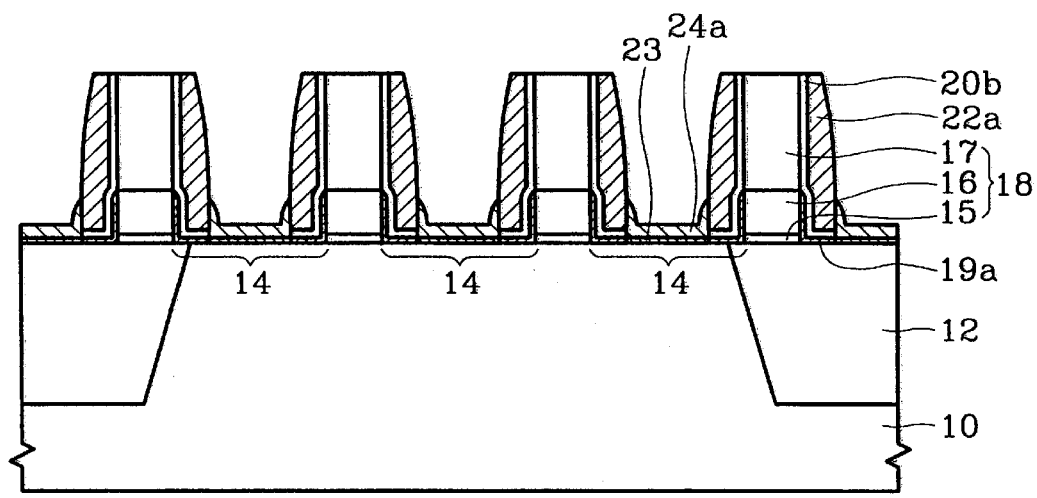
Figure 6:
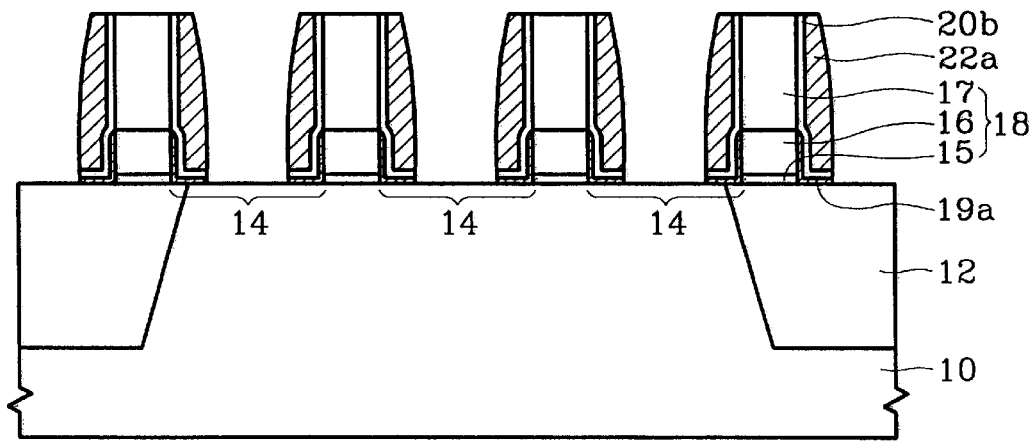
Figure 7:
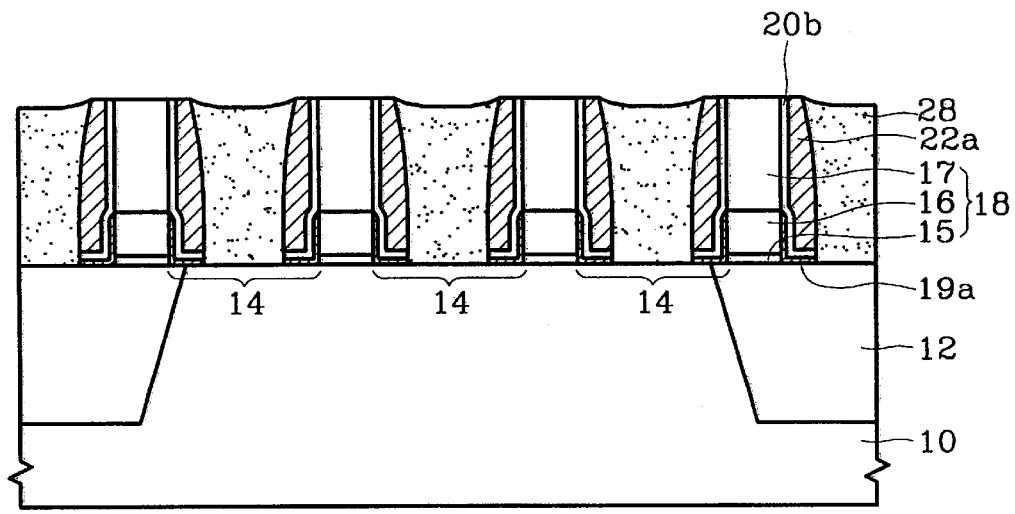
Figure 8:
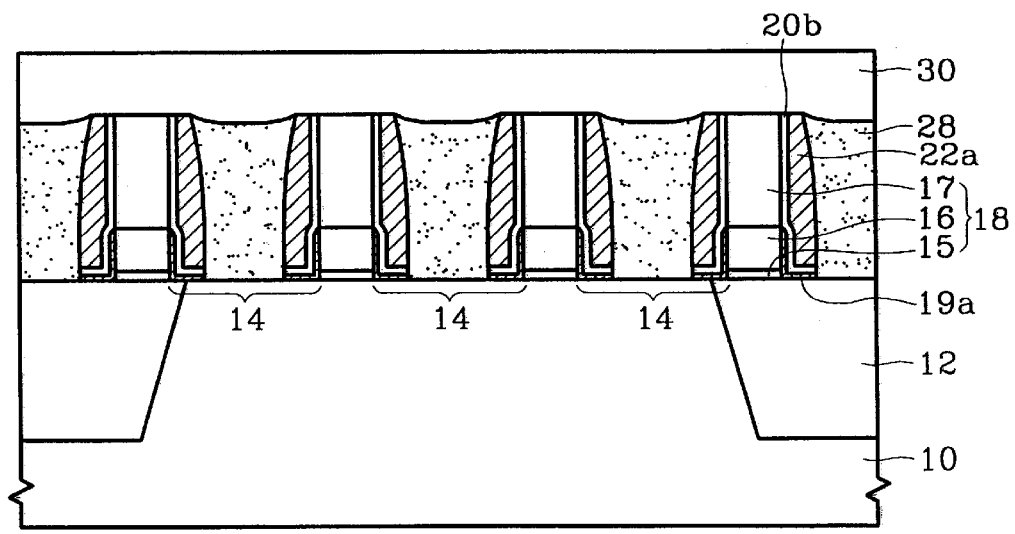

Hereinafter, a preferred embodiment of the present invention will be described in detail with reference to the attached drawings. However, the embodiment of the present invention can be modified into various other forms, and the scope of the present invention must not be interpreted as being restricted to the embodiment. The embodiment is provided to more completely explain the present invention to those skilled in the art. In drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

Figure 9:
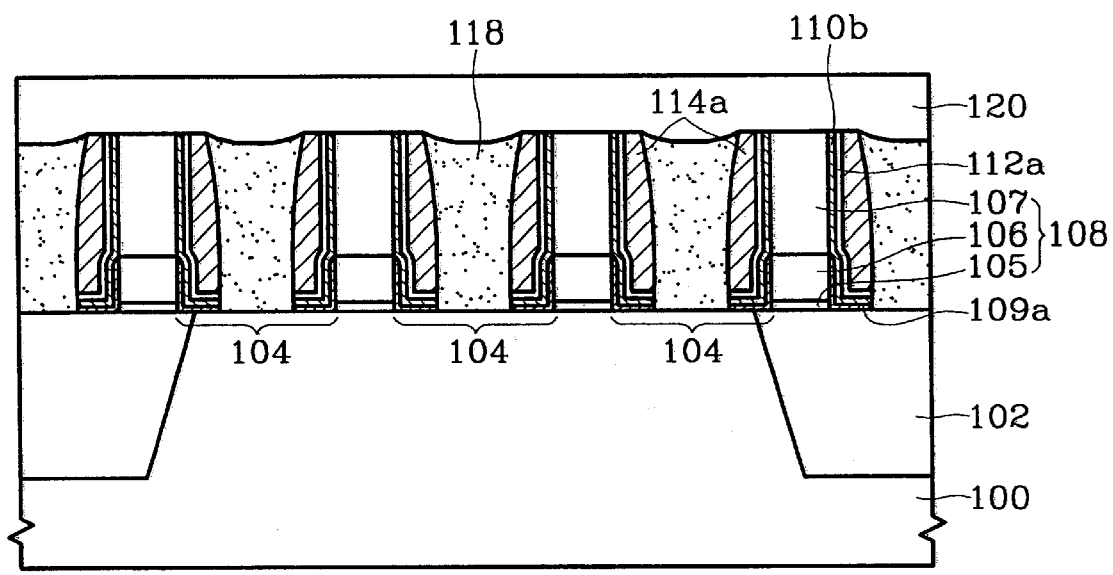
FIG. 9 is a cross-sectional view of a semiconductor substrate having a double-layered spacer according to a preferred embodiment of the present invention.

FIG. 9 is a cross-sectional view of a semiconductor device having a multi-layered spacer according to a preferred embodiment of the present invention. Referring to FIG. 9, the semiconductor device has a multi-layered spacer including a silicon nitride layer 110b, an oxide layer 112a, and an external spacer 114a on the sidewalls of a gate electrode 108. Hereinafter, the structure of the semiconductor device having the multi-layered spacer according to a preferred embodiment of the present invention will be described.

A semiconductor substrate 100 includes a gate electrode 108 having a gate oxide layer 105, a gate conductive layer 106, and a capping dielectric layer 107. A field area 102 is formed in the semiconductor substrate 100. The field area 102 may be formed according to the processes of shallow trench isolation or local oxidation of silicon (LOCOS). The gate conductive layer 106 may be a layer made of polysilicon and silicide. The capping dielectric layer 107 may be made of silicon nitride.

A gate polyoxide layer 109a is formed on both sidewalls of the gate conductive layer 106 and the gate oxide layer 105. The gate polyoxide layer 109a is in contact with a predetermined portion of the semiconductor substrate 100. The gate polyoxide layer 109a prevents the silicon nitride layer 110b from separating from the semiconductor substrate 100. It is preferable that the gate polyoxide layer 109a has a thickness of about 50~100 Å. The gate polyoxide layer 109a is an oxide layer formed at a temperature of 800~900° C. with the injection of oxygen.

The silicon nitride layer 110b is in contact with the sidewall of the capping dielectric layer 107 and the gate polyoxide layer 109a. It is preferable that the silicon nitride layer 110b has a thickness of 100~500 Å.

The oxide layer 112a is in contact with the silicon nitride layer 110b. In other words, the oxide layer 112a is formed between the silicon nitride layer 110b and the external spacer 114a. The oxide layer 112a is an oxide layer formed at a temperature of 600~800° C. using $SiCl_4$ and $O_2$. The oxide layer 112a preferably comprises a middle temperature oxide layer or a high temperature oxide layer having a dielectric constant of about 3.9. It is preferable that the oxide layer 112a has a thickness of 100-500 Å.

The external spacer 14a is in contact with the oxide layer 112a. It is preferable that the external spacer 114a be made of silicon nitride or silicon oxynitride.

A pad 118 is formed in the space between two gate electrodes 108 having a multi-layered spacer. An interlevel dielectric layer 120 is formed on the pad 118 and the gate electrodes 108 having the multi-layered spacer.

Figure 10:
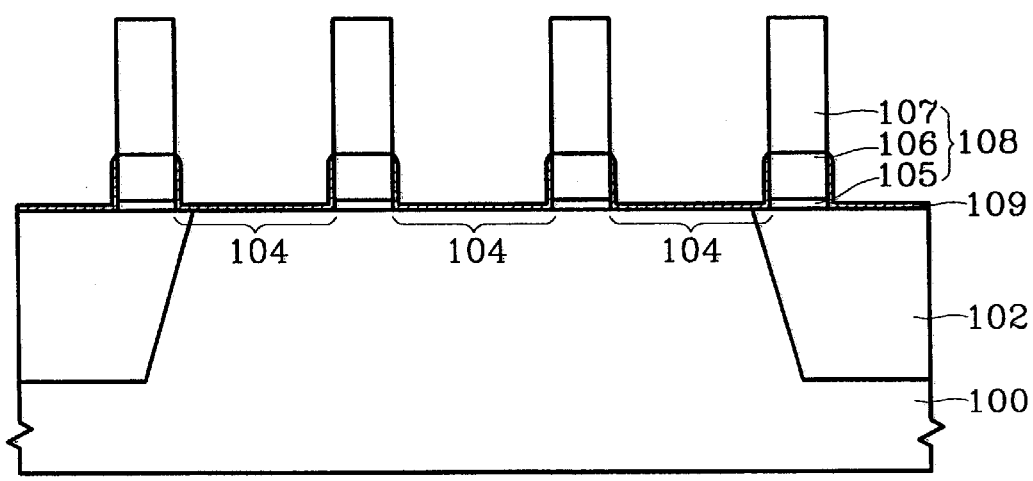
FIGS. 10 through 16 are cross-sectional views for describing the steps of manufacturing the semiconductor substrate having the double-layered spacer according to a preferred embodiment of the present invention.

FIGS. 10 through 16 are cross-sectional views for describing the steps of manufacturing a semiconductor device having a multi-layered spacer according to a preferred embodiment of the present invention. Referring to FIG. 10, a field area 102 is formed in a semiconductor substrate 100 to define an active area. The field area 102 may be formed according to shallow trench isolation or LOCOS. The active area includes an area 104 in which source and drain area will be formed and an area in which a gate electrode 108 will be formed.

A gate electrode 108 is formed on the semiconductor substrate 100 by a common method. For example, a gate oxide layer is grown on the semiconductor substrate 100 and then a gate conductive layer and a capping dielectric layer are deposited on the gate oxide layer. A photoresist pattern (not shown) is formed using a photolithography to define the gate electrode 108. The capping dielectric layer, the gate conductive layer, and the gate oxide layer are sequentially etched using the photoresist pattern as an etching mask. The photoresist pattern is removed and the gate electrode 108 is formed. The gate electrode 108 includes a gate oxide layer 105, a gate conductive layer 106, and a capping dielectric layer 107. It is preferable that the gate conductive layer 106 be made of polysilicon and silicide and the capping dielectric layer 107 be made of silicon nitride.

A gate polyoxide layer 109 is grown on the sidewalls of the gate conductive layer 106 and the gate oxide layer 105 and on the semiconductor substrate 100. The gate polyoxide layer 109 is formed to prevent direct adhesion between the semiconductor substrate 100 and a silicon nitride layer which will be described later. The silicon nitride layer does not adhere well to the semiconductor substrate 100 and thus the gate polyoxide layer 109 is formed to improve this poor adhesion. In a case where the capping dielectric layer 107 is formed of silicon nitride, the gate polyoxide layer 109 is not grown on the sidewalls and top of the capping dielectric layer 107, but only on the sidewalls of the gate conductive layer 106 and the gate oxide layer 105 and on the semiconductor substrate 100. The gate polyoxide layer 109 is formed at a temperature of about 800~900° C., preferably, at a temperature of about 850° C. with the injection of oxygen. It is preferable that the gate polyoxide layer 109 has a thickness of about 50~100 Å.

Impurity ions are implanted to a low density into the source and drain regions 104 using the gate electrode 108 as an ion implantation mask. Here, the gate polyoxide layer 109 serves as a buffer layer to reduce impacts when implanting impurity ions. In case of PMOS devices, 3-group impurities such as boron (B) are implanted but in case of NMOS devices, 5-group impurities such as arsenic (As) are implanted.

Figure 11:
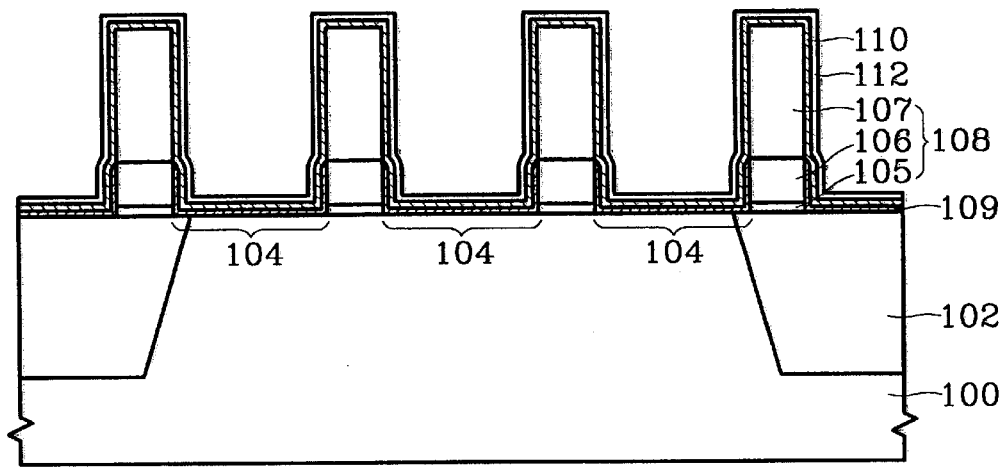

Referring to FIG. 11, a silicon nitride layer 110 is formed on the semiconductor substrate 100 having a step difference on which the gate polyoxide layer 109 is formed. It is preferable that the silicon nitride layer 110 have a thickness, of about 100~500 Å. The silicon nitride layer 110 is used as an etching stopper in a self-aligned etching process. Also, the silicon nitride layer 110 can serve as a blocking layer which blocks the penetration of carbon into the gate oxide layer 105.

An oxide layer 112 is formed on the silicon nitride layer 110 having a step difference therewith. It is preferable that the oxide layer 112 be formed at a temperature of about 600~800° C. using $SiCl_4$ and $O_2$. It is preferable that the oxide layer 112 be a middle temperature oxide layer or a high temperature oxide layer which has a thickness of about 100~500 Å. The oxide layer 112 serves as an etching stopper in an etching process of forming an external spacer and reduces the parasitic capacitance between the gate electrode 108 and a pad. In general, the dielectric constant of a silicon nitride layer is about 7.5 and the dielectric constant of an oxide layer is about 3.9. Compared with a conventional device having a single-layered spacer made of only silicon nitride, a device of the present invention can reduce the parasitic capacitance between the gate electrode 108 and the pad to about ½.

Figure 12:
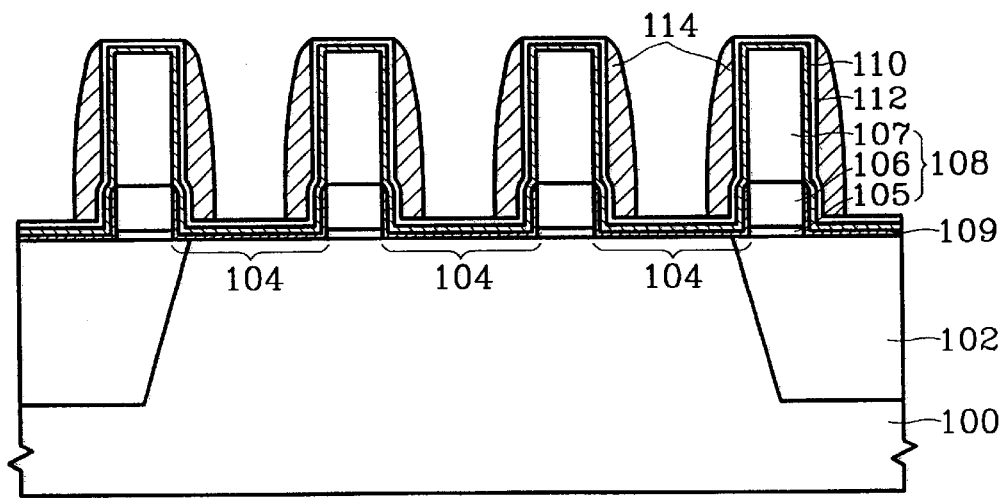

With reference to FIG. 12, a dielectric layer for an external spacer is deposited on the oxide layer 112 and then etched by an anisotropic dry method until the oxide layer is exposed, thereby forming an external spacer 114 on the sidewalls of the gate electrode 108. Here, it is preferable that a gas having an etch selectivity ratio of 10 or more of the dielectric layer for an external spacer to the oxide layer 112, e.g., a C-F-based gas having an etch selectivity ratio of about 12 of the dielectric layer to the oxide layer 112, be used as an etching gas. It is preferable that the C-F-based gas be a $CHF_3$. Here, it is preferable that oxygen ($O_2$) be used as a reaction gas and an inert gas such as argon (Ar) be used as an atmosphere. It is preferable that the anisotropic etching is performed at a pressure of about 20~100 mT, more preferably, at a pressure of about 50 mT, at a temperature of about 20~60° C., more preferably, at a temperature of about 40° C., and at a source power of about 400~800 W, more preferably, at a source power of about 600 W. It is preferable that the dielectric layer for the spacer be a silicon nitride ($Si_3N_4$) layer or a silicon oxynitride (SiON) layer. In the conventional semiconductor device having a double-layered spacer, the semiconductor substrate, i.e., silicon (Si), is recessed due to over-etching in an etching process of forming an external spacer. Meanwhile, in the preferred embodiment of the present invention, the silicon nitride layer 110 and the gate polyoxide layer 109 are formed underneath the oxide layer 112 and serve as buffer layers. Thus, the semiconductor substrate does not become recessed and the refresh characteristics of the device are improved.

Impurity ions are very densely implanted into the source and drain area 104 to form a source and a drain. The source and drain area 104 has a lightly doped drain (LDD) in which the regions next to the gate electrode 108 are lightly doped with impurities and the central area between the gate electrodes 108 is heavily doped with impurities. In case of PMOS devices, 3-group impurities such as boron (B) are implanted but in case of NMOS devices, 5-group impurities such as arsenic (As) are implanted.

Figure 13:
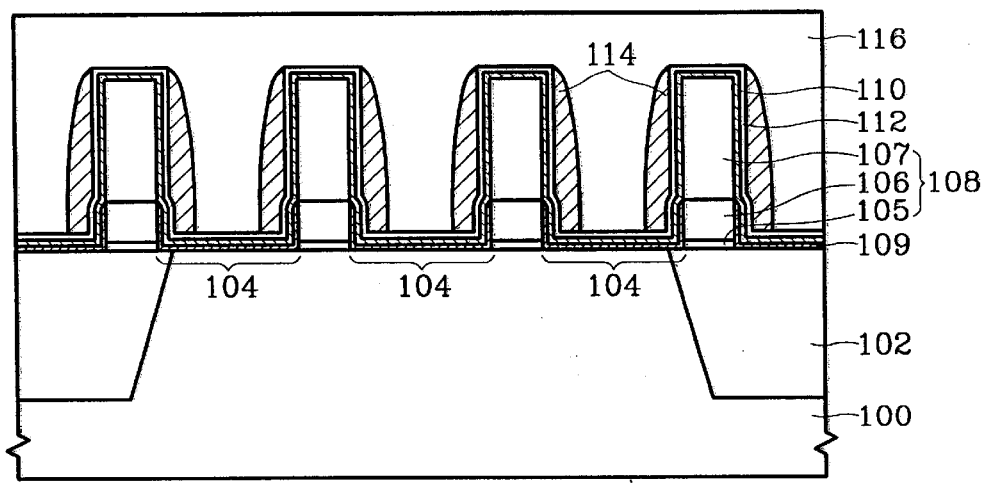

Referring to FIG. 13, a first interlevel dielectric layer 116 is deposited on the semiconductor substrate 100 and then planarized by chemical mechanical polishing. It is preferable that the first interlevel dielectric layer 116 be one of a high density plasma (HDP) layer, a boro phosphorus silicate glass (BPSG) layer, an undoped silicate glass (USG) layer, a plasma enhanced-tetra ethyl ortho silicate (PE-TEOS) layer and a spin on glass (SOG) layer.

Figure 14:
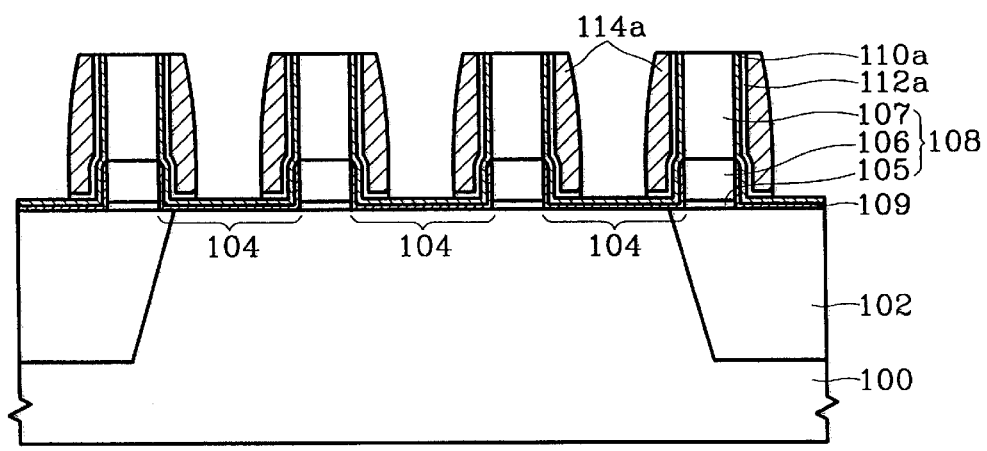

With reference to FIG. 14, in order to form a self-aligned contact, i.e., an area in which a pad will be formed, a photoresist pattern (not shown) is formed using photolithography to define an area in which a pad will be formed. The first interlevel dielectric layer 116 is etched using the photoresist pattern as an etching mask to form an area in which a pad will be formed. Here, it is preferable that a gas having an etch selectivity ratio of at least 10 of the first interlevel dielectric layer 116 to the silicon nitride layer, e.g., an etch selectivity ratio of about 15 of the first interlevel dielectric layer 116 to the silicon nitride layer, be used as an etching gas. It is preferable that a C-F-based gas such as $CF_4$, $C_5F_8$, and $C_4F_8$ is used as the etching gas. The first interlevel dielectric layer 116 is etched until a silicon nitride layer 110a on the source and drain area 104 is exposed. The oxide layer 112 is removed during the etching process except a portion of the oxide layer 112 protected by an external spacer 114a. In other words, the oxide layer 112a on the source and drain area 114 which is not protected by the external spacer 114a and the oxide layer 112 on the gate electrode 108 is removed during the etching process. The silicon nitride layer 110 on the gate electrode 108 is also removed when the first interlevel dielectric layer 116 is etched. A capping dielectric layer 107 is etched and recessed to a predetermined thickness. The photoresist pattern is removed using a common method, e.g., an ashing process.

Figure 15:
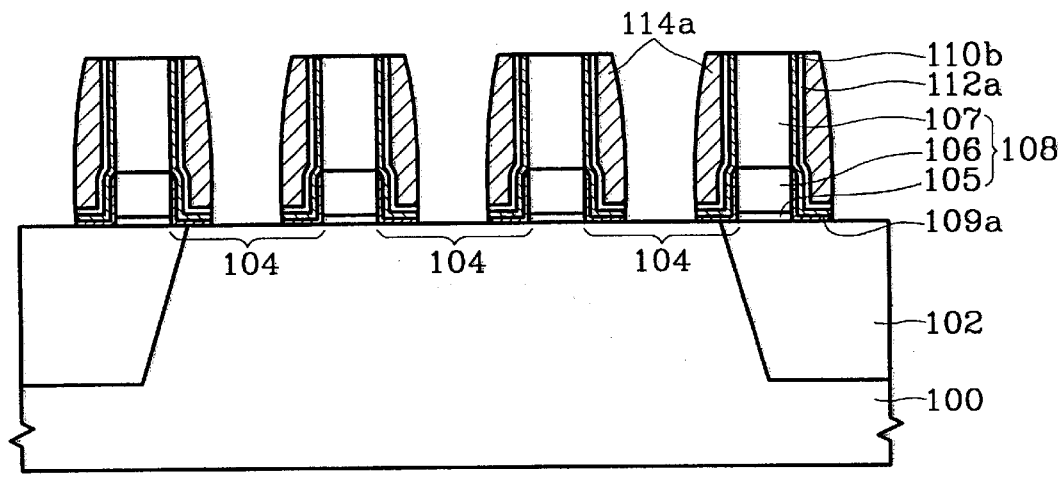

Referring to FIG. 15, the silicon nitride layer 110a and the gate polyoxide layer 109 on the semiconductor substrate 100 between the gate electrodes 108 are removed to form a pad electrically connected to the source and drain.

Figure 16:
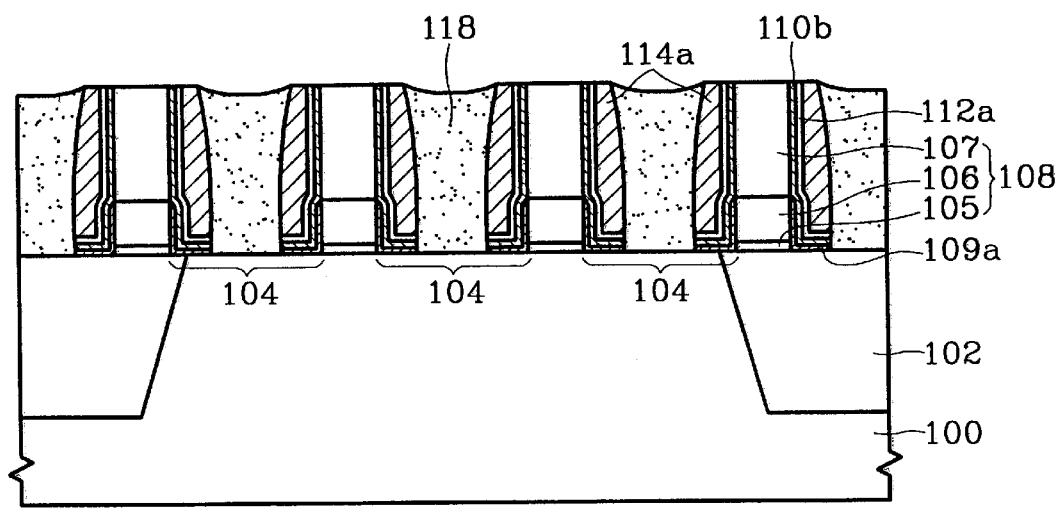

With reference to FIG. 16, a conductive layer is deposited on the semiconductor substrate 100 to fully fill the space between the gate electrodes 108 and is then planarized by chemical mechanical polishing, thereby forming a pad 118. It is preferable that the pad 118 be formed of polysilicon.

Returning to FIG. 9, a second interlevel dielectric layer 120 is formed on the semiconductor substrate 100 on which the pad 118 is formed. It is preferable that the second interlevel dielectric layer 120 be a dielectric layer having an excellent step coverage characteristic, e.g., a PE-TEOS layer.

In a semiconductor device having a multi-layered spacer and a method of manufacturing the same according to the present invention, a gate electrode is formed and then a silicon nitride layer is formed on the resulting structure. As a result, a conventional problem, i.e., the penetration of carbon from a second interlevel dielectric layer into a gate oxide layer through an oxide layer can be mitigated. In addition, the conventional problem of recessed silicon in a core or periphery area in an etching process of forming an external spacer, can also be improved. The oxide layer serves as an etching stopper in an etching process of forming an external spacer and reduces the parasitic capacitance between the gate electrode and the pad.

In the conventional semiconductor device having a double-layered spacer, an external spacer is formed and then a second gate polyoxide layer is grown to form an etching stopper. Thus, oxygen penetrated into the gate oxide layer through the oxide layer underneath the external spacer. As a result, the thickness of the gate oxide layer varies and threshold voltage varies. Meanwhile, in the present invention, an etching stopper does not need to be formed after an external spacer is formed. Thus, a second gate polyoxide layer does not need to be grown and as a result, threshold voltage does not vary. In addition, the conventional problem of lateral diffusion of highly doped impurities by the second gate polyoxide layer's growth at a high temperature, can also be improved. Thus, the device and method of the present invention can prevent the length of a channel from being shortened.

Although the invention has been described in detail with reference to a preferred embodiment thereof, it will be apparent to one of ordinary skill in the art that modifications to the described embodiment may be made without departing from the spirit and scope of the invention.

What is claimed is:

1. A method of manufacturing a semiconductor device having a multi-layered spacer, comprising:
    (a) forming a plurality of gate electrodes each including a gate oxide layer, a gate conductive layer, and a capping dielectric layer on a semiconductor substrate;
    (b) forming a polyoxide layer on sidewalls of the gate oxide layer and the gate conductive layer and on the semiconductor substrate;
    (c) forming a silicon nitride layer over the surface of the semiconductor substrate having a step difference therewith;
    (d) depositing an oxide layer over the surface of the silicon nitride layer having a step difference therewith;
    (e) forming an external spacer by depositing a dielectric layer for a spacer over the surface of the oxide layer having a step difference therewith and then etching the dielectric layer by an anisotropic method;
    (f) forming a first interlevel dielectric layer on the entire surface of the semiconductor substrate;
    (g) forming a photoresist pattern which defines an area in which a pad will be formed;
    (h) etching the first interlevel dielectric layer using the photoresist pattern as an etching mask, using the silicon nitride layer originally formed at step (c) as an etch stop;
    (i) removing the photoresist pattern; and
    (j) thereafter removing the silicon nitride layer originally formed at step (c) and the gate polyoxide layer originally formed at step (b) on the semiconductor substrate between the gate electrodes.

2. The method of claim 1, further comprising lightly implanting impurity ions into the semiconductor substrate between steps (b) and (c).

3. The method of claim 1, further comprising heavily implanting impurity ions into the semiconductor substrate between steps (e) and (f).

4. The method of claim 1, further comprising, following step (j):
    forming a pad by depositing a conductive layer on the semiconductor substrate and then planarizing the resultant structure by chemical mechanical polishing; and
    forming a second interlevel dielectric layer on the semiconductor substrate on which the pad is formed.

5. The method of claim 1, wherein the gate polyoxide layer is formed at a temperature of about 800~900° C. with the injection of oxygen.

6. The method of claim 1, wherein the gate polyoxide layer prevents the silicon nitride layer from separating from the semiconductor substrate and has a thickness of about 50~100 Å.

7. The method of claim 1, wherein the silicon nitride layer is formed to a thickness of about 100~500 Å.

8. The method of claim 1, wherein the oxide layer is formed at a temperature of about 600~800° C. using $SiCl_4$ and $O_2$.

9. The method of claim 1, wherein the oxide layer is a middle temperature oxide layer or a high temperature oxide layer having a dielectric constant of 3.9, and has a thickness of about 100~500 Å.

10. The method of claim 1, wherein the dielectric layer for the spacer is formed of oxide or silicon nitride.

11. The method of claim 1, wherein the anisotropic etching in step (e) is performed until the oxide layer is exposed.

12. The method of claim 1, wherein in the etching of step (e), a C-F-based gas having an etch selectivity ratio of greater than 10 of the dielectric layer for the spacer to the oxide layer is used, oxygen is used as a reaction gas, and an inert gas is used as an atmosphere.

13. The method of claim 1, wherein the anisotropic etching in step (e) is performed at a pressure of about 20~100 mT, at a temperature of about 20~60° C., and at a source power of 400~800 W.

14. The method of claim 1, wherein the first interlevel dielectric layer is one selected from the group consisting of a HDP layer, a BPSG layer, a USG layer, a PETEOS layer and an SOG layer.

15. The method of claim 1, wherein the etching in step (h) is performed until the silicon nitride layer on the semiconductor substrate between the gate electrodes is exposed.

16. The method of claim 1, wherein the etching in step (h) uses a C-F-based gas having an etch selectivity ratio of greater than 10 of the first interlevel dielectric layer to the silicon nitride layer.

* * * * *